US006188594B1

(12) United States Patent
Ong

(10) Patent No.: US 6,188,594 B1
(45) Date of Patent: Feb. 13, 2001

(54) REDUCED-PITCH 6-TRANSISTOR NMOS CONTENT-ADDRESSABLE-MEMORY CELL

(75) Inventor: Adrian E. Ong, Pleasanton, CA (US)

(73) Assignee: NeoMagic Corp., Santa Clara, CA (US)

( * ) Notice: Under 35 U.S.C. 154(b), the term of this patent shall be extended for 0 days.

(21) Appl. No.: 09/328,957

(22) Filed: Jun. 9, 1999

(51) Int. Cl.$^7$ ........................................... G11C 15/00
(52) U.S. Cl. ............................ 365/49; 365/189.07
(58) Field of Search .................. 365/49, 189.07, 365/189.01; 711/108, 100

(56) References Cited

U.S. PATENT DOCUMENTS

| 3,701,980 | 10/1972 | Mundy | 340/173 |
| 4,791,606 | 12/1988 | Threewitt et al. | 365/495 |
| 4,831,585 | 5/1989 | Wade et al. | 365/49 |
| 4,991,136 | 2/1991 | Mihara | 365/49 |
| 5,111,427 | 5/1992 | Kobayashi et al. | 365/49 |
| 5,351,208 | 9/1994 | Jiang | 365/49 |
| 5,428,564 | 6/1995 | Winters | 365/49 |
| 5,949,696 | * 9/1999 | Threewitt | 365/49 |

* cited by examiner

Primary Examiner—David Nelms
Assistant Examiner—Hoai Ho
(74) Attorney, Agent, or Firm—Stuart T. Auvinen

(57) ABSTRACT

A content-addressable memory (CAM) cell uses only n-channel (NMOS) transistors. A total of six transistors (6T) are used in the cell. Dynamic storage and differential sensing are used. A pair of bit lines carry true and complement data. A word line connected to the gates of pass transistors couples the bit lines to gates of storage transistors. The sources of the storage transistors are grounded. Charge is dynamically stored on the gates of the storage transistors when the pass transistors are turned off. One storage transistor has a gate charged to a high voltage and is thus on, while the other storage transistor has its gate discharged to a low voltage and is thus off. The drains of the storage transistors are connected to a match line through a pair of match transistors. The gates of the match transistors are connected to the bit lines. During a compare operation, the test data and its complement are applied to the bit lines, turning one of the match transistors on and the other off. The match transistors and storage transistors form two series connections to the match line. When both a match transistor and a storage transistor in series are on, the match line is discharged, indicating a mismatch. An exclusive-OR (XOR) function is performed by the match and storage transistors. The match transistors can be cross-connected to the opposite bit lines to match data polarity for writes.

14 Claims, 5 Drawing Sheets

REDUCED-PITCH 6-TRANSISTOR NMOS CONTENT-ADDRESSABLE-MEMORY CELL

FIELD OF THE INVENTION

This invention relates to NMOS semiconductor memories, and more particularly to content-addressable memory (CAM) cells.

BACKGROUND OF THE INVENTION

Semiconductor memories are constructed from memory cells that are arrayed into rows and columns to form a large array of thousands or millions of cells. Standard static or dynamic-random-access memory (RAM) cells each store one bit of data that can be read or written as needed.

A more specialized memory cell is sometimes needed. One specialized memory is a content-addressable memory (CAM). In addition to the RAM functions of writing and storing data, the CAM also tests or compares the stored data to determine if the data matches test data applied to the memory. When the newly-applied test data matches the data already stored in the memory, a match line is activated, indicating that the stored data matches the test data. CAMs are especially useful for fully-associative memories such as look-up tables and memory-management units.

Each CAM cell is essentially a RAM cell with a match function. Match functions can be implemented by adding an exclusive-OR (XOR) or inverse XOR gate to each RAM cell. The XOR output is applied to a match line that connects many CAM cells together in a row or column. The match signal can then be output from the memory.

CAM cells were originally constructed from static RAM (SRAM) cells by adding transistors to perform the XOR function. More recently, CAM cells have also been constructed from dynamic RAM (DRAM) cells. DRAM cells have an area and cost advantage over SRAM cells since a small capacitor stores charge rather than a bi-stable or cross-coupled pair of transistors.

Dynamic Cam Cells—FIG. 1

FIG. 1 shows a prior-art dynamic CAM cell using six transistors. U.S. Pat. No. 5,428,564 by Winters shows a six-transistor (6T) CAM cell based on earlier dynamic CAM cells of just 4 or 5 transistors. While the earlier 4T and 5T CAM cells were small in area, these cells were particularly noise sensitive and slow, having relatively low voltage ratios.

Winter's CAM cell is written by raising the voltage on the write line, which activates pass transistors 12, 14. True and complement data are applied to bit lines BL and BLB, which are passed through pass transistors 12, 14 to store charge on the gates of storage transistors 18, 16. The sources of storage transistors 16, 18 are also connected to bit lines BL, BLB so that an additional voltage difference from gate to source is created, increasing the stored charge. For example, when BL is high and BLB is low, the high voltage from BL is transmitted to the gate of storage transistor 18, while the low voltage from BLB is applied to the source of storage transistor 18. At the same time, the low voltage from BLB is transmitted to the gate of storage transistor 16, while the high voltage from BLB is applied to the source of storage transistor 16. Thus storage transistors 16, 18 are charge oppositely during a write. Inverse read signal RD-NOT is high during write, and diode transistor 10 stays off so that the drains of storage transistors 16, 18 do not discharge the bit lines.

During a read, signal RD-NOT is low, and diode transistor 10 pulls low the drains of storage transistors 16, 18. One of bit lines BL, BLB is pulled low, depending on which of storage transistors 16, 18 has its gate charged high during the last write. The cell's data can then be read as a voltage difference across the bit lines using a sense amplifier. The CAM cell can be periodically refreshed by reading and then writing back the data to the cell.

During a compare or match operation, match line MATCH and RD-NOT are high and WRITE is low. The bit lines BL and BLB are precharged low. One of the bit lines is then pulled high with the test data. When the test data matches the stored data, storage transistor 16 or 18 connected to the raised bit line is off, preventing the drains from being charged high. The low voltage is applied to the gate of match transistor 20, which does not turn on, keeping MATCH high. When the test data mismatches the stored data, the storage transistor 16 or 18 connected to the raised bit line is turned off, charging high the drains of storage transistors 16, 18. The high drain voltage is applied to the gate of match transistor 20, turning it on, discharging MATCH low.

Winter's CAM cell uses only n-channel (NMOS) transistors, and has a small area. However, bit-line capacitance is high, since the sources of storage transistors 16, 18 are connected directly to the bit lines, as are pass transistors 12, 14. The high bit-line capacitance slows read and write operations. Also, there is the danger of sub-threshold leakage through storage transistors 12, 14 and of disturbance of the storage node from the bit lines. Another disadvantage is the layout efficiency in the MATCH/WL direction. The pitch in this direction may be greater than desired. The gate voltage of transistor 20 can only go as high as VCC−Vt; thus its current drive is weak.

CMOS Dynamic Cam Cell—FIG. 2

FIG. 2 is a prior-art dynamic CAM cell using CMOS transistors. See U.S. Pat. No. 4,791,606 by Threewitt et al. A single bit of data is stored on capacitor 28 when pass transistor 22 is activated by word line WL. Only one bit line BL is used.

An XOR gate is formed by n-channel transistors 24, 28 and p-channel transistors 21, 23. The stored data from capacitor 28 is applied to the gates of transistors 23, 26, while the bit line BL drives the gates of transistors 21, 24. The source of n-channel transistor 26 and the drain of n-channel transistor 23 are driven by mask line MASK, which is pulled low when the CAM cell is being compared. MASK can be pulled high to mask off or disable some cells from being compared. The drain of n-channel transistor 24 and the source of n-channel transistor 21 are connected to match line MATCH.

During a compare or match operation, the inverse data is applied to bit line BL, which is sometimes designated BL/CB to indicate that true data is applied during write, but complement data during compare. Word line WL is kept low so pass transistor 22 is off. Thus the stored data is applied to the gates of transistors 23, 26, while the complement of the test data is applied to the gates of transistors 21, 24 from the bit line. When the stored data and the complement driven to BL do not match, one of transistors 24, 26 in series is on and the other is off. Likewise, one of transistors 21, 23 is on and the other is off. Thus neither series connection has both transistors on, and the match line is not discharged low to MASK, which is driven low during compare. Thus a match is signaled.

When the stored data does match the complement data on BL, the match line is pulled low (a mis-match). If the stored data is high and BL is high, n-channel transistors 24, 26 are both on but p-channel transistors 21, 23 are both off.

MATCH is discharged through n-channel transistors 24, 26. For low stored data and BL low, p-channel transistors 21, 23 discharge MATCH.

While such a CMOS CAM cell is useful, integrating p-channel transistors 21, 23 into each cell is expensive. The spacing from a p-channel transistor to an n-channel transistor is large, since separate P and N wells must be made. The spacing between two n-channel transistors is much smaller. Thus the size of the cell is larger when p-channel transistors are included with the n-channel transistors. Also, a single bit line makes reading and writing slow since an absolute voltage rather than a voltage difference is sensed or driven.

Pull MATCH low is a problem using the P-channel transistors. These devices can only be pulled to VSS+Vt. For low-voltage operation, performance may be severely affected. Also, for the same drive strength, the P-devices must be about twice the size of the N-devices. Also, the cell cannot be read.

What is desired is a CAM cell using only n-channel transistors. It is desired to use dynamic storage rather than static storage to reduce the size of the CAM cell. A dynamic CAM cell is desired that contains only NMOS transistors. A compact layout for an NMOS dynamic CAM cell is also desired.

SUMMARY OF THE INVENTION

A dynamic-storage, differential-access content-addressable memory (CAM) cell has a pair of bit lines including a true bit line and a complement bit line. They conduct a data bit and a complement of the data bit to the CAM cell. A word line indicates when to write data from the bit lines to the CAM cell. A first storage transistor has a first gate for dynamically storing a state of the CAM cell. A second storage transistor has a second gate for dynamically storing a complement of the state of the CAM cell.

A first pass transistor has a gate controlled by the word line. It connects the true bit line to the first gate during a write operation. A second pass transistor has a gate controlled by the word line. It connects the complement bit line to the second gate during the write operation.

A first match transistor is coupled to the first storage transistor. It discharges current from the match line to the first storage transistor during a compare operation. It has a gate controlled by a first bit line of the pair of bit lines. The first bit line receives a test data bit during the compare operation. A second match transistor is coupled to the second storage transistor to discharging current from the match line to the second storage transistor during the compare operation. It has a gate controlled by a second bit line of the pair of bit lines. The second bit line receives a complement of the test data bit during the compare operation.

When the first storage transistor is charged when the CAM cell was written to a high state, the match line is discharged to indicate a mis-match when the first match transistor is activated by the first bit line being in a high state. However, when the second storage transistor is charged when the CAM cell was written to a low state, the match line is discharged to indicate a is-match when the second match transistor is activated by the second bit line being in a high state. The match line remains high when the test data bit matches the state of the CAM cell. Thus the CAM cell has six transistors.

In further aspects the first bit line is the complement bit line. The second bit line is the true bit line. The CAM cell is written to the high state when the true bit line has a higher voltage than the complement bit line. When the test data is in the high state, the true bit line is driven with a higher voltage than the complement bit line. Thus the true bit line carries true write data for the write operation and true test data for compare operation, the CAM cell being cross-connected.

In still further aspects the state of the CAM cell stored on the first gate of the first storage transistor is lost after a period of time due to leakage. The CAM cell is periodically re-written with the state to refresh the state of the CAM cell before the state is lost. Thus the CAM cell is periodically refreshed.

In still further aspects the first and second storage transistors, the first and second pass transistors, and the first and second match transistors are all n-channel metal-oxide-semiconductor (NMOS) transistors. The CAM cell contains no p-channel transistors. Thus the CAM cell is a 6T all-NMOS cell.

DETAILED DESCRIPTION

The present invention relates to an improvement in memory cells. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that eliminating p-channel transistors from the content-addressable memory (CAM) cell is critical to area efficiency. The inventor has further realized that the cell's exclusive-OR (XOR) function can be implemented entirely with n-channel transistors if the complement of the stored data is available. The complement data can be made available when differential storage is used.

The inventor has further realized that differential access is faster than single-ended access. Thus providing a pair of bit lines rather than just one bit line provides significant speed advantages. Differential storage is more robust and less sensitive to noise and leakage, perhaps allowing for less frequent refreshing.

Although standard dynamic RAM cells use single-ended rather than differential storage, differential sensing can be used with dynamic storage. The size advantage of dynamic storage can then be combined with the speed and stability advantages of differential sensing.

The inventor has devised a CAM cell that uses differential storage, thereby making both true and complement data available to the XOR function within the cell. Dynamic storage is still used even though differential sensing and storage is used. Such differential dynamic storage can eliminate a need for a discrete capacitor since a smaller charge can be sensed differentially.

Figure 1:
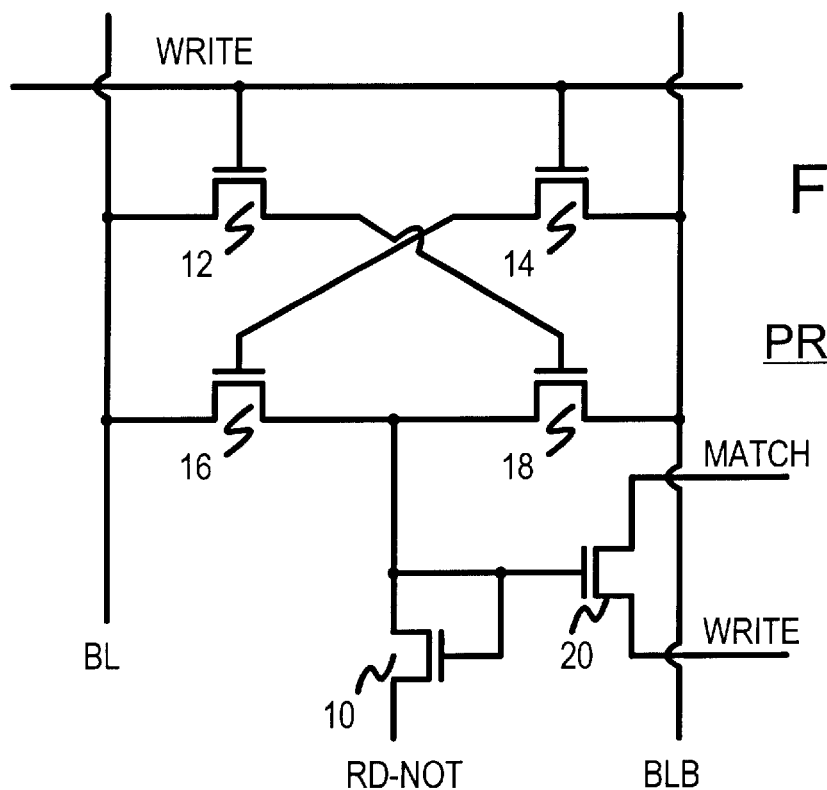
FIG. 1 shows a prior-art dynamic CAM cell using six transistors.
Figure 2:
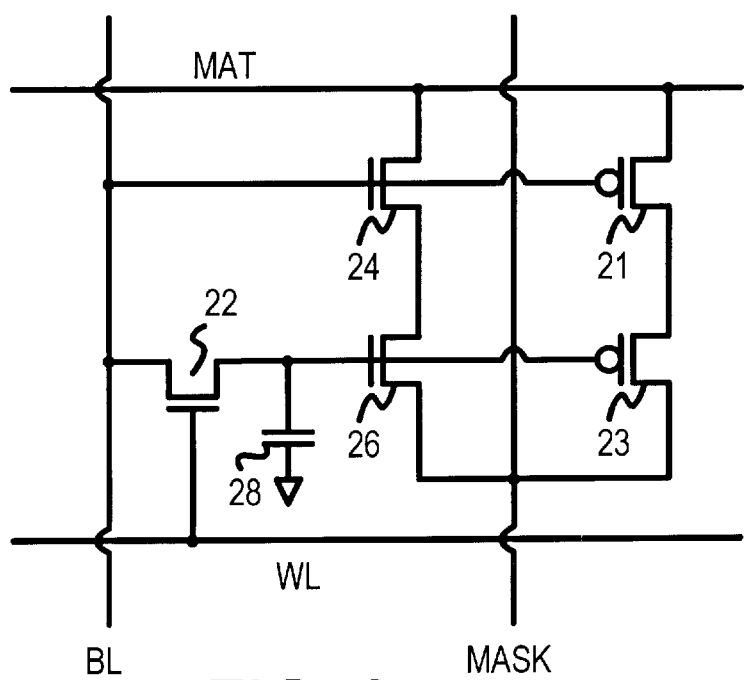
FIG. 2 is a prior-art dynamic CAM cell using CMOS transistors.
Figure 3:
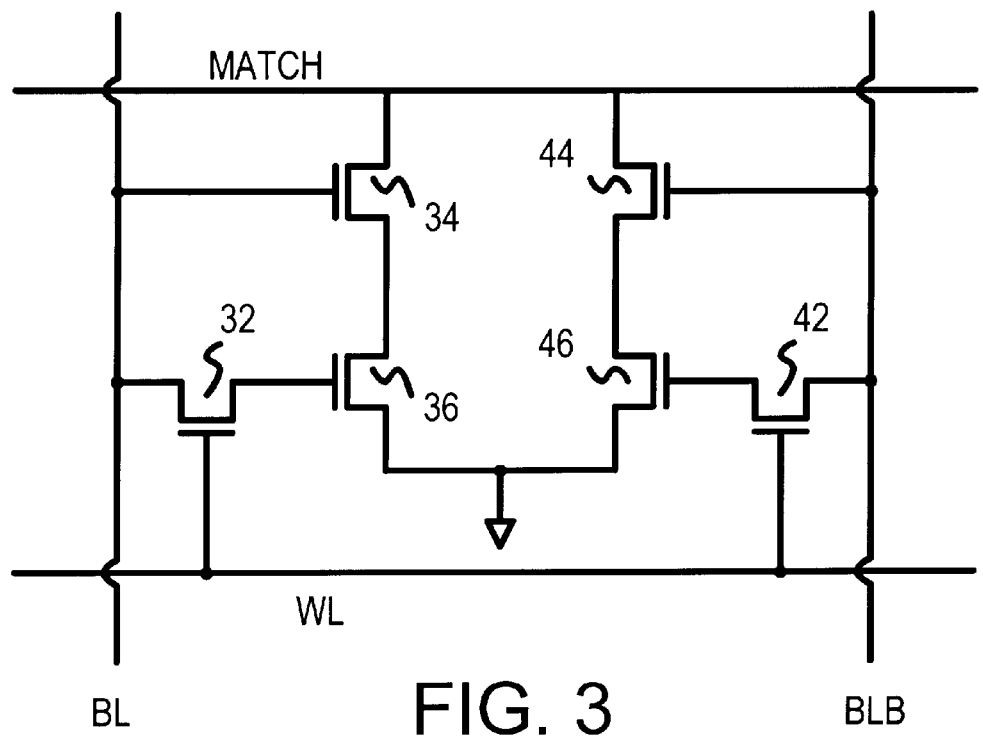
FIG. 3 is a diagram of a dynamic differential CAM cell with just 6 NMOS transistors.

Basic Cam Cell—FIG. 3

FIG. 3 is a diagram of a dynamic differential CAM cell with just 6 NMOS transistors.

This CAM cell stored one bit of data, but the data is stored differentially as true and complement data.

A pair of bit lines BL, BLB carry true and complement data to a column of cells. Pass transistors 32, 42 are turned on when word line WL is driven with a high voltage during a write operation. Pass transistors 32, 42 connect bit lines BL, BLB to the gates of storage transistors 36, 46. One gate is charged high while the other gate is charged low. For a data 1, bit line BL is high, storing a high voltage on the gate of storage transistor 36. Bit line BLB is low, driving a low voltage on the gate of storage transistor 46. When word line WL is driven low, storage transistor 36 stores a positive charge while storage transistor 46 stores little or no charge. The opposite occurs when a data 0 is written to the cell.

Match line MATCH is held low during reads and writes so that storage transistors 34, 44 act as capacitors to ground. The sources of storage transistors 36, 46 are connected to ground. A virtual or switched ground such as a MASK line can be substituted. MATCH is precharged high before a compare operation.

The cell can be read by equalizing and precharging both bit lines BL, BLB to an intermediate voltage before word line WL is raised. One bit line is then driven low and the other is driven high by charge sharing as pass transistors 32, 42 are turned on. A sensitive sense amplifier can then detect a slight voltage difference on bit lines BL, BLB. The cell can be refreshed by writing the sensed data back to the bit lines.

N-channel transistors 34, 36, 44, 46 perform an XOR function since true and complement data are stored on the gates of storage transistors 36, 46. During a match or compare operation, word line WL is low and pass transistors 32, 42 remain off. Thus the stored charge on the gates of storage transistors 34, 44 is isolated and not disturbed.

The test data from bit lines BL, BLB are applied to the gates of match transistors 34, 44, respectively. The complements of the test data are applied to these bit lines during the compare operation. Thus bit line BL carries the complement of the test data, and can be designated BL/CB, where CB refers to the inverse compare data or compare-bar. Complement bit line BLB carries the true test data, and can be designated BLB/C.

The stored data or stored charge on the gate of storage transistor 36 turns this transistor on when high but off when the data (charge) is low. When the test data is low (a mismatch), the test-data complement CB is high, and thus a high signal is applied to bit line BL/CB. Both transistors 34, 36 are turned on, causing match line MATCH to be discharged to ground. Thus a mis-match is signaled.

MATCH is also pulled low when the stored data is high but the test data is low. The low stored data causes the gate of storage transistor 36 to be low, keeping it off. However, the gate of storage transistor 46 is charged high, turning it on. Bit line BLB receives the true test data (high), which is applied to the gate of transistor 44, turning it on. Since both transistors 44, 46 are turned on, the MATCH line is discharged through these series-connected transistors. A mismatch is signaled.

When the test data matches the stored data in the CAM cell, match line MATCH remains high. For example, when the cell stores a 1, storage transistor 36 is on but storage transistor 46 is off. The true test data is applied to bit line BLB while the complement test data is applied to bit line BL. Since the test data is also a 1, BL is low while BLB is high. Thus transistor 34 is off, blocking current flow through storage transistor 36. Thus no discharge path to ground occurs, since transistors 34, 46 are off. The opposite occurs when the cell stores a 0 which is compared to a 0 test data.

The CAM cell requires only 6 transistors. Since all 6 transistors are NMOS, the cell does not have to expand for well-to-well spacing as only a P-well or p-substrate is present within the cell. Of course, a full CMOS process may be used for the periphery circuits.

Figure 4:
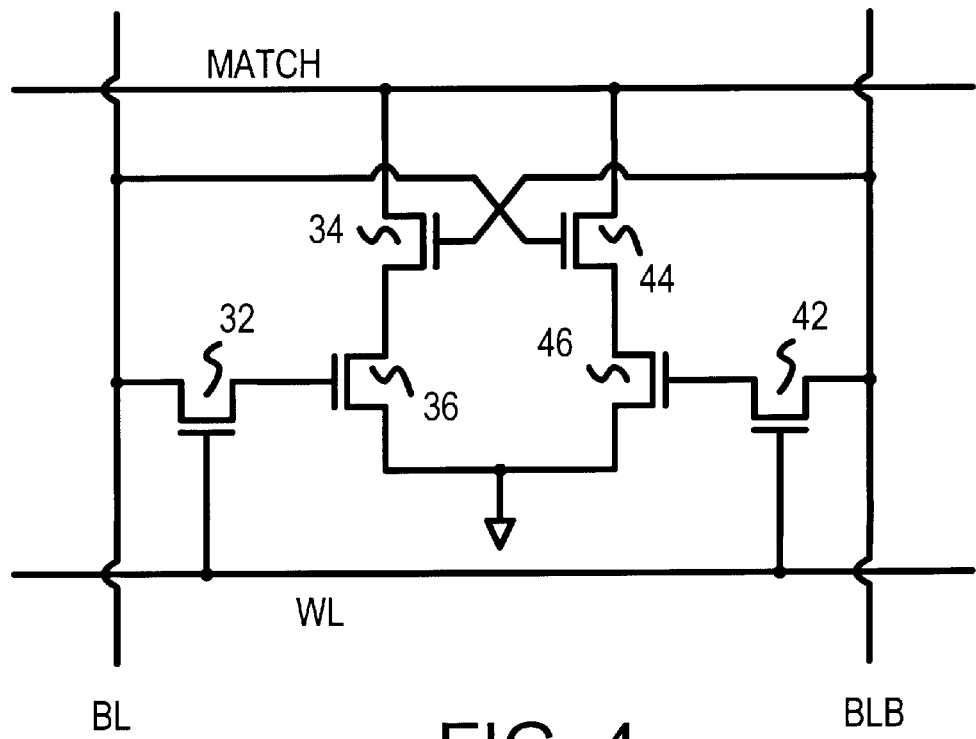
FIG. 4 shows a 6T CAM cell with a cross-connection of the bit lines to the match transistors.

Cross-Connected Cam Cell—FIG. 4

FIG. 4 shows a 6T CAM cell with a cross-connection of the bit lines to the match transistors. One disadvantage of the cell of FIG. 3 is that the opposite data must be applied to the bit lines during compare than was applied during writing. The cross-connected cell of FIG. 4 overcomes this problem. The gate of match transistor 34 is driven by complement bit line BLB rather than by BL. Similarly, the gate of match transistor 44 is driven by bit line BL rather than by BLB.

Since match transistor 34 is in series with storage transistor 36, MATCH is pulled low when the cell stores a 1 and BLB is high, or when the cell stores a 0 and BL is high. Otherwise MATCH remains high. The writing and reading of the cell operate in the same manner as described earlier for the cell of FIG. 3.

A match occurs when BL matches the cell's stored data. MATCH is left high when the cell stores a 1 and BLB is low, or when the cell stores a 0 and BL is low. Thus bit line BL carries the true test data, and can be designated BL/C. BLB carries the complement test data and can be designated BLB/CB.

While the cross-connected cell is simpler to operate, the area may be increased. The layout requires a cross-over for the bit lines to the gates of the match transistors. This cross-over may require additional area in some layouts. In one embodiment, pass transistors 32, 42 are 1 micron in width, while storage transistors 36, 46 and match transistors 34, 44 are 2 microns in width.

Figure 5:
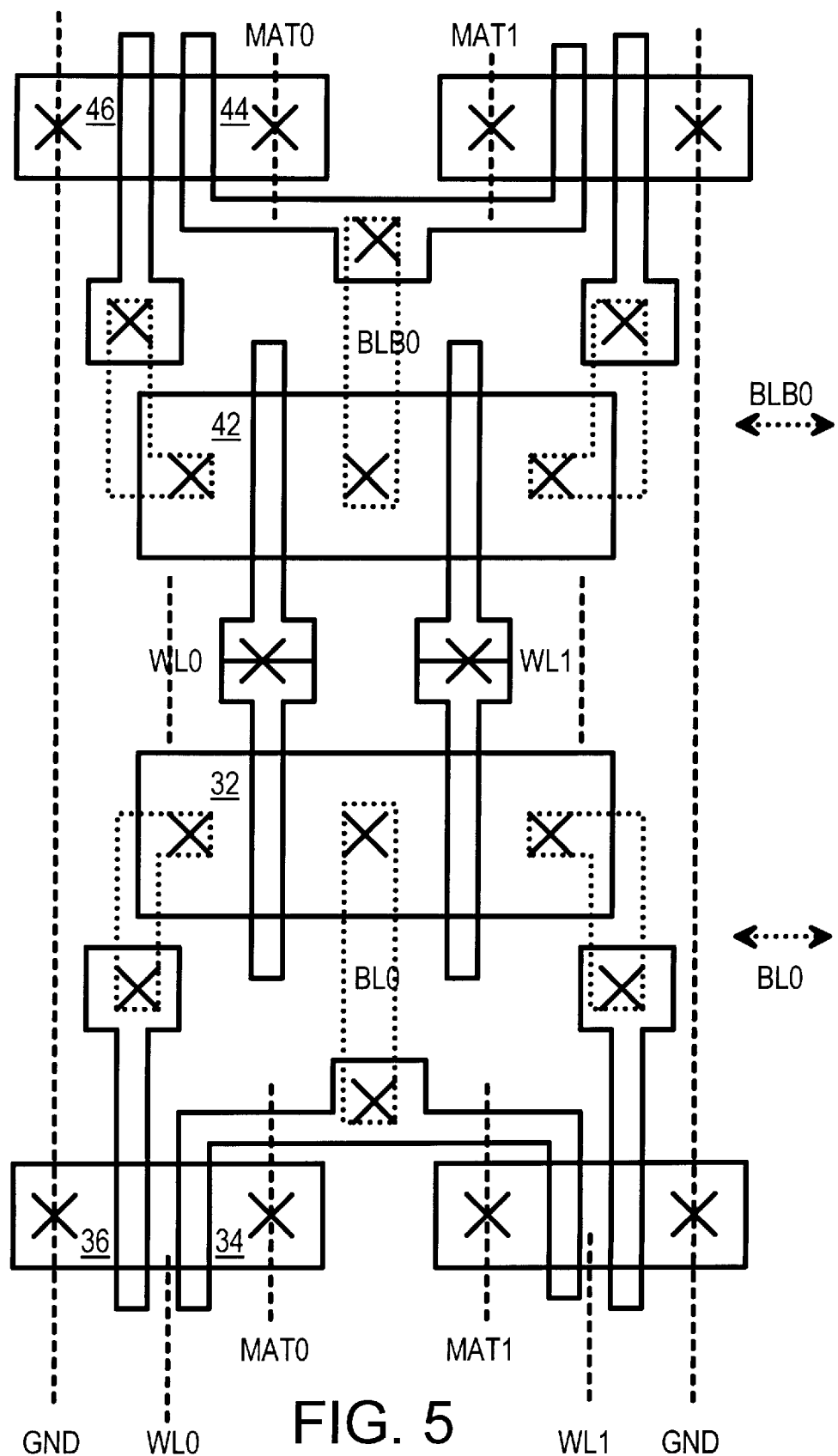
FIG. 5 shows a layout for a pair of the CAM cells of FIG. 3.

Layout of Cam Cell—FIG. 5

FIG. 5 shows a layout for a pair of the CAM cells of FIG. 3. For clarity, only the active and polysilicon lines are shown in detail, outlined as solid lines. First layer metal connections are shown as dotted outlines, while second-layer metal lines are only shown as dashed lines without width. The second-metal lines all run vertically across the entire cell, although this is shown only for the ground lines at the left and right edges of the cells. The word lines WL0, WL1 and match lines MAT0, MAT1 also run vertically across the entire cells. Additional first-metal lines run horizontally across the cells, carrying the bit lines BL0 and BLB0. The number 0 is a suffix or index indicating the row or column of the cell.

Transistors are formed where polysilicon lines cross active or n+diffusion areas. The active areas are shown as 4-sided rectangles while the polysilicon gates are thinner multi-sided polygons with tabs at the ends for contacts that connect the polysilicon line to a metal layer. Contacts as shown as "X"es, either on active areas or on the polysilicon tabs.

Two CAM cells are shown in FIG. 5. Each cell is tall and narrow, and the cells are placed side-by-side. Cell 0 is on the left, while cell 1 is on the right. Transistors in the left cell are labeled. The top-most diffusion area contains transistors 46, 44, with the match line connecting to the right side of the diffusion for match transistor 44. The next diffusion area contains pass transistor 42.

The gate of storage transistor 46 is driven through pass transistor 42 from bit line BLB0. Bit line BLB0 makes a connection (not shown) from first or third metal to the polysilicon gate of transistor 44 and the drain of pass transistor 42. Similar connections are made to the pass and match transistors in the right-side CAM cell immediately to the right. Thus a single bit-line connection serves two adjacent CAM cells. A shared metal-diffusion contact is made for the bit line BLB0 to two CAM cells, saving area per cell.

The word line WL0 is routed in second metal and runs vertically across the cell. A connection is made in the center of the cell from second metal to the polysilicon gate of pass transistors 32, 42. A tab of first metal (not shown) may be used between the second-metal and polysilicon layers. A similar connection from the next vertical row's WL1 to another pair of pass transistors is made in the right-hand cell.

Pass transistor 32 is formed in the next diffusion area, just above the bottom diffusion area, which contains transistors 34, 36. Another connection is made to match line MAT0 for the bottom diffusion area.

Each CAM cell has 2.5 second-metal lines that run vertically across the cell:
  Match line MAT
  Word line WL
  half of ground line GND.
The ground line is shared with the next cell and thus counts as half of a metal line.

Each CAM cell has 2 first or third metal lines running horizontally across the cell:
  Bit line BL
  Inverse Bit line BLB.

The "row" (word-line) direction is vertical while the column (bit-line) direction is horizontal as shown in FIG. 5. Of course, the array of CAM cells can be rotated or mirrored as needed on an actual integrated circuit chip.

Many other layouts are possible as are many variations to the layout shown. Sharing the bit-line contacts among two adjacent cells saves area. Sharing the ground contacts among two adjacent cells also saves area.

Figure 6:
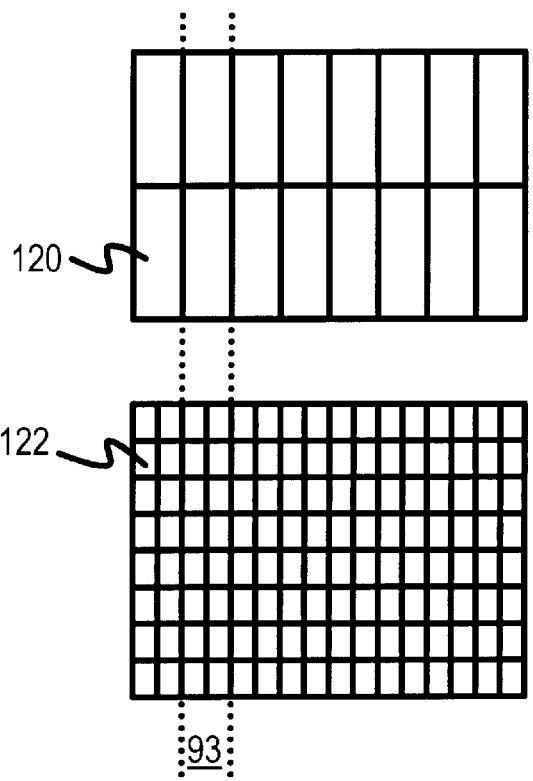
FIG. 6 shows pitch-matching of an array of CAM cells to a DRAM array.

FIG. 6 shows pitch-matching of an array of CAM cells to a DRAM array. The CAM cell layout of FIG. 5 minimizes the WL/MATCH pitch. In one application, the CAM array (WL/MAT) is pitch-matched to the bit lines of an embedded DRAM. This layout allows for a 2 to 1 pitch matching; that is, two DRAM cells to one CAM cell.

FIG. 6 shows a 2×8 array of CAM cells 120. Below the CAM cells is an 8×16 array of DRAM cells, an embedded DRAM. The width of each CAM cell 120 is exactly the width of 2 DRAM cells 122. Thus pitch 93 fits 2 DRAM cells 120 to the pitch of one CAM cell 120.

Figure 7:
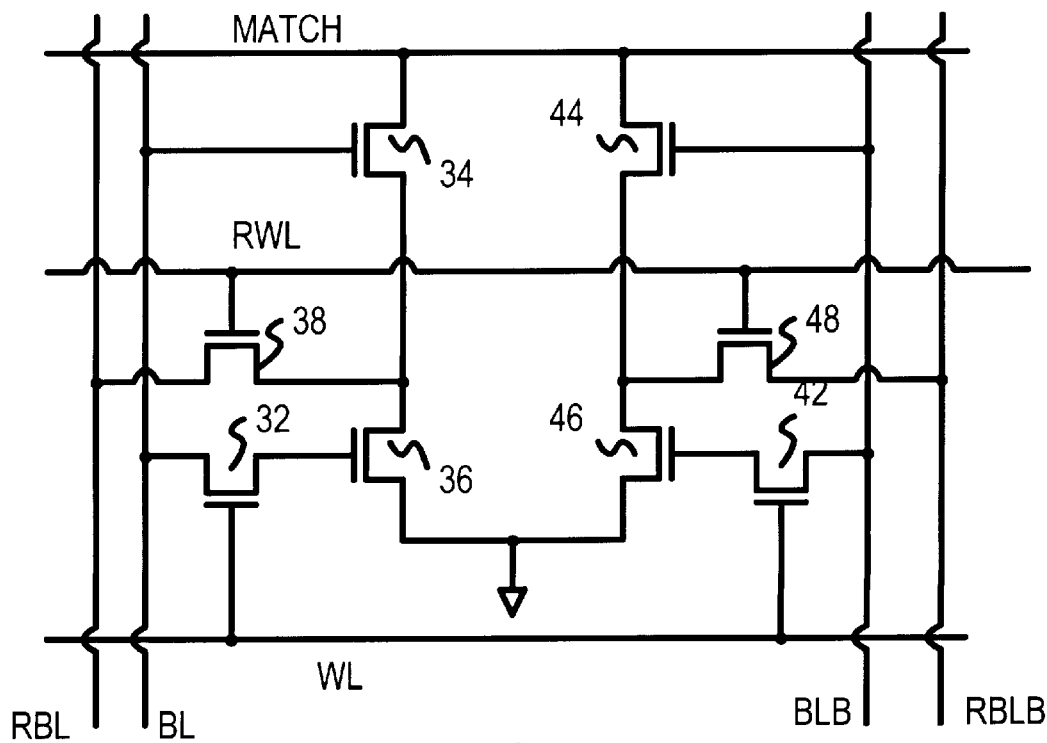
FIG. 7 shows a dynamic CAM cell with an additional pair of read bit lines and read pass transistors.

Cam Cell with Separate Read Port—FIG. 7

FIG. 7 shows a dynamic CAM cell with an additional pair of read bit lines and read pass transistors. The CAM cell operates in much the same manner as described earlier for the cell of FIG. 3. However, reading is performed using a dedicated read port. The cell is useful as a FIFO cell since separate read and write ports are provided, allowing asynchronous reads and writes. Since read is possible, this dynamic cell may also be refreshed.

Read pass transistors 38, 48 are activated by read word line RWL during a read operation. Pass transistors 32, 42 are kept off during a read since write word line WL is kept low. Read pass transistor 38 is connected to the source of match transistor 38 and to the drain of storage transistor 36. Read pass transistor 48 is connected to the source of match transistor 48 and to the drain of storage transistor 46.

Since read pass transistors 38, 48 are not connected to the gates of storage transistors 36, 46, the stored charge is not disturbed by the read operation. Instead, one of storage transistors 36, 46 drains charge from one of the read bit lines when read pass transistors 38, 48 are activated. The read bit lines RBL, RBLB can be equalized and precharged before RWL is activated. The read bit lines can be precharged either high or low, but high is preferred.

For example, when the cell stores a 1, storage transistor 36 is on but storage transistor 46 is off. When read pass transistors 38, 48 are turned on, storage transistors 36, 46 are connected to read bit lines RBL, RBLB. Storage transistor 36 then sinks charge from read bit line RBL through read pass transistor 38, lowering its voltage. Since storage transistor 46 is off, the other read bit line RBLB remains high. A voltage difference begins to occur between the read bit lines, and can be amplified by a sense amplifier.

The write bit lines can both be kept low during the read operation. The match line is also driven low. Simultaneous reads and writes are also possible when reads and writes are to different rows. During simultaneous read/write operation, MATCH is precharged low. The write bit lines are driven while WL is on, and at the same time RWL is on and data is driven onto the Read bit lines.

In one embodiment, pass transistors 32, 42 are 1 micron in width, while storage transistors 36, 46 and match transistors 34, 44 are 1.4 microns in width. Read pass transistors 38, 48 are 2 microns in width. The gate length is 0.25 micron.

Figure 8:
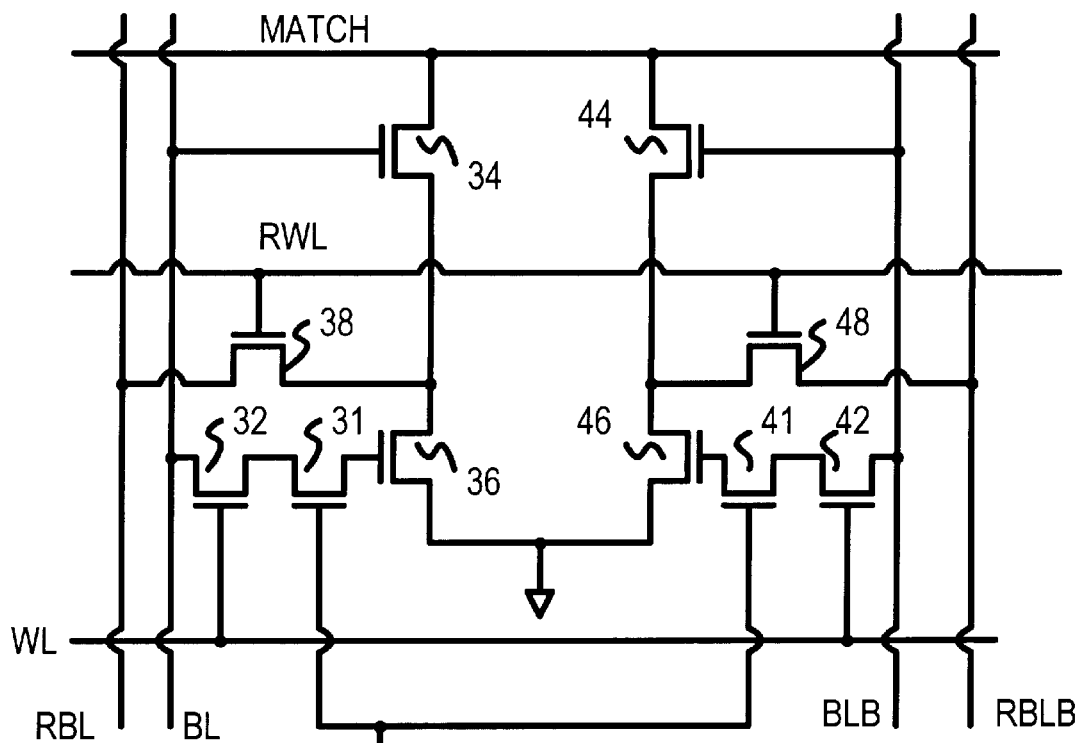
FIG. 8 shows an alternate embodiment with write-enable transistors.

FIG. 8 shows an alternate embodiment with write-enable transistors. The cell of FIG. 8 is similar to that of FIG. 3 and the function of transistors with the same reference numbers as FIG. 3 operate in a similar manner for the cell of FIG. 8.

Write-enable transistors 31, 41 are added in series with pass transistors 32, 42. The gates of write-enable transistors 31, 41 are controlled by write-enable signal WEN. When WEN is low, writing to the cell is blocked even when the cell is otherwise selected by the word line WL. Write-enable allows some cells to be masked off when other cells are written. For example, write enables can enable some bytes of cells to be written while other bytes of cells are not written.

Figure 9:
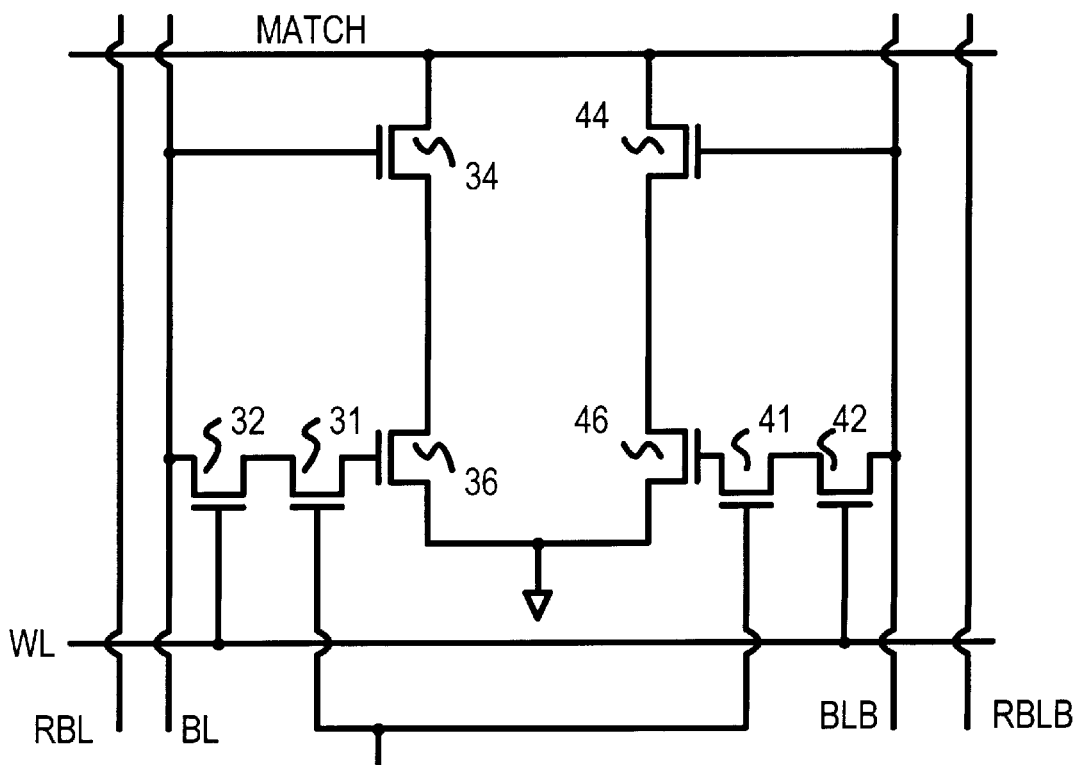
FIG. 9 is another alternate embodiment with write-enable transistors but without read pass transistors.

FIG. 9 is another alternate embodiment with write-enable transistors but without read pass transistors. Write-enable transistors 31, 41 are added in series with pass transistors 32, 42, but read pass transistors 38, 48 of FIG. 8 are deleted. Thus the cell can b written but not read. Some applications such as imaging do not require reading since the data is not stored for more than the refresh period. Instead, the data is quickly used and discarded.

Advantages of the Invention

The CAM cell uses only n-channel transistors. The size of the cell is significantly reduced since p-channel transistors are eliminated. The cell size is further reduced by using dynamic storage rather than static storage in the CAM cell. The all-NMOS dynamic CAM cell has as few as six transistors, and a compact layout is facilitated.

Differential writing, reading, and sensing are faster than single-ended sensing. Providing a pair of bit lines rather than just one bit line provides significant speed advantages.

Differential storage is more robust and less sensitive to noise and leakage, perhaps allowing for less frequent refreshing. The CAM cell can be pitch-matched to an embedded DRAM, simplifying global layout. Another advantage is an area savings.

Alternate Embodiments

Several other embodiments are contemplated by the inventor. For example many layouts of the cell are possible. The cell could be implemented entirely in PMOS rather than in NMOS. Various device sizes may be substituted. Many variations of process technology are known and may be substituted. The word lines may use boosted voltages from charge pumps for chips with low power-supply voltages. The memory array can be rotated so that rows can run vertically rather than horizontally and columns run horizontally rather than vertically.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A dynamic-storage, differential-access content-addressable memory (CAM) cell comprising:

a pair of bit lines including a true bit line and a complement bit line, for conducting a data bit and a complement of the data bit to the CAM cell;

a word line for indicating when to write data from the bit lines to the CAM cell;

a first storage transistor having a first gate for dynamically storing a state of the CAM cell;

a second storage transistor having a second gate for dynamically storing a complement of the state of the CAM cell;

a first pass transistor having a gate controlled by the word line, for connecting the true bit line to the first gate during a write operation;

a second pass transistor having a gate controlled by the word line, for connecting the complement bit line to the second gate during the write operation;

a match line;

a first match transistor, coupled to the first storage transistor, for discharging current from the match line to the first storage transistor during a compare operation, having a gate controlled by a first bit line of the pair of bit lines, the first bit line receiving a test data bit during the compare operation; and a second match transistor, coupled to the second storage transistor, for discharging current from the match line to the second storage transistor during the compare operation, having a gate controlled by a second bit line of the pair of bit lines, the second bit line receiving a complement of the test data bit during the compare operation;

wherein when the first storage transistor is charged when the CAM cell was written to a high state, the match line is discharged to indicate a mis-match when the first match transistor is activated by the first bit line being in a high state;

wherein when the second storage transistor is charged when the CAM cell was written to a low state, the match line is discharged to indicate a mis-match when the second match transistor is activated by the second bit line being in a high state;

wherein the match line remains high when the test data bit matches the state of the CAM cell, a pair of read bit lines including a true read bit line and a complement read bit line, for differentially sensing the state of the CAM cell during a read operation;

a read word line for indicating when a read operation is reading the state of the CAM cell;

a first read transistor, having a gate controlled by the read word line, for connecting a drain of the first storage transistor to the true read bit line during the read operation; and a second read transistor, having a gate controlled by the read word line, for connecting a drain of the second storage transistor to the complement read bit line during the read operation, whereby the drains of the first and second storage transistors are sensed during the read operation, the CAM cell containing 8 transistors.

2. The dynamic-storage, differential-access CAM cell of claim 1:

wherein the first bit line is the complement bit line;

wherein the second bit line is the true bit line;

wherein the CAM cell is written to the high state when the true bit line has a higher voltage than the complement bit line wherein when the test data is in the high state, the true bit line is driven with a higher voltage than the complement bit line, whereby the true bit line carries true write data for the write operation and true test data for compare operation, the CAM cell being cross-connected.

3. The dynamic-storage, differential-access CAM cell of claim 1:

wherein the first bit line is the true bit line;

wherein the second bit line is the complement bit line;

wherein the CAM cell is written to the high state when the true bit line has a higher voltage than the complement bit line wherein when the test data is in the high state, the complement bit line is driven to a higher voltage than the true bit line, whereby the true bit line carries true write data for the write operation but complement test data for compare operation, the CAM cell not being cross-connected.

4. The dynamic-storage, differential-access CAM cell of claim 3:

wherein the state of the CAM cell stored on the first gate of the first storage transistor is lost after a period of time due to leakage;

wherein the CAM cell is periodically re-written with the state to refresh the state of the CAM cell before the state is lost, whereby the CAM cell is periodically refreshed.

5. The dynamic-storage, differential-access CAM cell of claim 4 wherein the first and second storage transistors, the first and second pass transistors, and the first and second match transistors are all n-channel metal-oxide-semiconductor (NMOS) transistors, wherein the CAM cell contains no p-channel transistors, whereby the CAM cell is an all-NMOS cell.

6. The dynamic-storage, differential-access CAM cell of claim 5 wherein the match line is precharged to a high voltage before each compare operation.

7. The dynamic-storage, differential-access CAM cell of claim 4 wherein the CAM cell is arrayed into rows and columns of cells, wherein the true bit line and the complement bit line span the array in a metal layer;

wherein a contact from the metal layer to an active area of the first match transistor is shared among two adjacent CAM cells;

wherein a contact from the metal layer to an active area of the second match transistor is shared among the two adjacent CAM cells, whereby contacts for the true bit line and for the complement bit line are shared among the two adjacent CAM cells.

8. The dynamic-storage, differential-access CAM cell of claim 7 wherein only one metal line for the true bit line is present for the two adjacent CAM cells;

wherein only one metal line for the complement bit line is present for the two adjacent CAM cells, whereby metal lines are shared among pairs of CAM cells.

9. The dynamic-storage, differential-access CAM cell of claim 8 wherein a contact to a metal line connected to a ground is shared among two adjacent CAM cells.

10. A memory cell with a compare gate comprising:

a pair of bit lines including a true bit line and a complement bit line, for conducting a data bit and a complement of the data bit to the memory cell;

a word line for indicating when to write data from the bit lines to the memory cell;

first storage transistor means having a first gate for dynamically storing a state of the memory cell;

second storage transistor means having a second gate for dynamically storing a complement of the state of the memory cell;

first pass transistor means having a gate controlled by the word line, for connecting the true bit line to the first gate during a write operation;

second pass transistor means having a gate controlled by the word line, for connecting the complement bit line to the second gate during the write operation;

a match line;

first match transistor means, coupled to the first storage transistor means, for discharging current from the match line to the first storage transistor means during a compare operation, having a gate controlled by a first bit line of the pair of bit lines, the first bit line receiving a test data bit during the compare operation; and second match transistor means, coupled to the second storage transistor means, for discharging current from the match line to the second storage transistor means during the compare operation, having a gate controlled by a second bit line of the pair of bit lines, the second bit line receiving a complement of the test data bit during the compare operation;

wherein the first bit line is the complement bit line;

wherein the second bit line is the true bit line;

wherein the memory cell is written to the high state when the true bit line has a higher voltage than the complement bit line wherein when the test data is in the high state, the true bit line is driven with a higher voltage than the complement bit line, whereby the true bit line carries true write data for the write operation and true test data for compare operation, the memory cell being cross-connected and whereby the first and second storage transistor means and the first and second match transistor means are a compare gate.

11. The memory cell of claim 10 wherein the first bit line is the true bit line;

wherein the second bit line is the complement bit line;

wherein the memory cell is written to the high state when the true bit line has a higher voltage than the complement bit line wherein when the test data is in the high state, the complement bit line is driven to a higher voltage than the true bit line, whereby the true bit line carries true write data for the write operation but complement test data for compare operation, the memory cell not being cross-connected.

12. The memory cell of claim 10 wherein the state of the memory cell stored on the first gate of the first storage transistor means is lost after a period of time due to leakage;

wherein the memory cell is periodically re-written with the state to refresh the state of the memory cell before the state is lost, whereby the memory cell is periodically refreshed.

13. A memory cell with a compare gate comprising:

a pair of bit lines including a true bit line and a complement bit line, for conducting a data bit and a complement of the data bit to the memory cell;

a word line for indicating when to write data from the bit lines to the memory cell;

first storage transistor means having a first gate for dynamically storing a state of the memory cell;

second storage transistor means having a second gate for dynamically storing a complement of the state of the memory cell;

first pass transistor means having a gate controlled by the word line, for connecting the true bit line to the first gate during a write operation;

second pass transistor means having a gate controlled by the word line, for connecting the complement bit line to the second gate during the write operation;

a match line;

first match transistor means, coupled to the first storage transistor means, for discharging current from the match line to the first storage transistor means during a compare operation, having a gate controlled by a first bit line of the pair of bit lines, the first bit line receiving a test data bit during the compare operation; and second match transistor means, coupled to the second storage transistor means, for discharging current from the match line to the second storage transistor means during the compare operation, having a gate controlled by a second bit line of the pair of bit lines, the second bit line receiving a complement of the test data bit during the compare operation;

wherein the state of the memory cell stored on the first gate of the first storage transistor means is lost after a period of time due to leakage;

wherein the memory cell is periodically re-written with the state to refresh the state of the memory cell before the state is lost, wherein the first and second pass transistor means each comprise a series-connected pair of transistors with a gate connected to a write-enable signal, whereby the memory cell has a write-enable control and whereby the memory cell is periodically refreshed and the first and second storage transistor means and the first and second match transistor means are a compare gate.

14. The memory cell of claim 13 wherein each memory cell has a same width as two dynamic-random-access memory (DRAM) cells, whereby the memory cells are content-addressable-memory (CAM) cells that are pitch-matched to an embedded DRAM array.

* * * * *

UNITED STATES PATENT AND TRADEMARK OFFICE
CERTIFICATE OF CORRECTION

PATENT NO. : 6,188,594 B1
DATED : February 13, 2001
INVENTOR(S) : Ong et al.

It is certified that error appears in the above-identified patent and that said Letters Patent is hereby corrected as shown below:

<u>Title page,</u>
Item [75], the second inventor -- Ronen Stilkol, --, and his residence -- Rishon Le Zion, Israel --. should be added.

Signed and Sealed this

Twenty-fifth Day of September, 2001

Attest:

*Nicholas P. Godici*

NICHOLAS P. GODICI
*Attesting Officer    Acting Director of the United States Patent and Trademark Office*